United States Patent [19]

Rosencher et al.

[11] Patent Number: 5,086,327
[45] Date of Patent: Feb. 4, 1992

[54] CAPACITIVE DETECTOR OF ELECTROMAGNETIC WAVES

[75] Inventors: Emmanuel Rosencher, Bagneux; Børge Vinter, Paris; Paul Bois, Echirolles, all of France

[73] Assignee: Thomson-CSF, Puteaux, France

[21] Appl. No.: 593,992

[22] Filed: Oct. 9, 1990

[30] Foreign Application Priority Data

Oct. 12, 1989 [FR] France ................ 89 13326

[51] Int. Cl.⁵ .................................... H01L 27/14
[52] U.S. Cl. ............................ 357/30; 357/4; 357/16
[58] Field of Search .......... 357/4, 30 E, 30 G, 1 G

[56] References Cited

U.S. PATENT DOCUMENTS

| | | | |
|---|---|---|---|
| 4,745,452 | 5/1988 | Sollner | 357/30 |
| 4,905,056 | 2/1990 | Berndt et al. | 357/30 E |
| 4,987,458 | 1/1991 | Gaylord et al. | 357/30 E |

OTHER PUBLICATIONS

Choi et al., "Multiple Quantum Well 10 μm GaAs/Al$_x$Ga$_{1-x}$As Infrared Detector with Improved Responsivity", Applied Physics Letters, vol. 50 (1987), Jun. 22, 1987, pp. 1814–1816.

Chang et al., "Infrared Optical Devices of Layered Structure", IBM Technical Disclosure Bulletin, vol. 20, No. 5, Oct. 1977, pp. 2019–20.

Primary Examiner—William Mintel
Attorney, Agent, or Firm—Oblon, Spivak, McClelland, Maier & Neustadt

[57] ABSTRACT

A capacitive detector of electromagnetic waves, comprises three electron levels, wherein an internal barrier prevents a strong coupling between two levels of two neighboring wells. During an irradiation, the electrons are excited from a first level to a second level. The electrons then relax towards a third level until they relax, by tunnel effect, towards the first level. During the transition from the first level towards the third level, a dipole is created. This dipole can be detected by a detector, through the measurement of a potential difference at the terminals of the device.

8 Claims, 4 Drawing Sheets

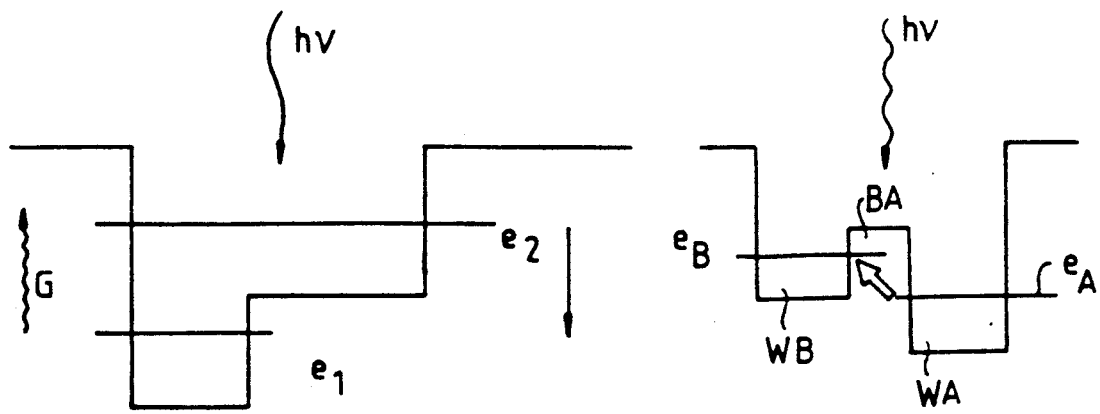
FIG. 1a PRIOR ART
FIG. 1b PRIOR ART
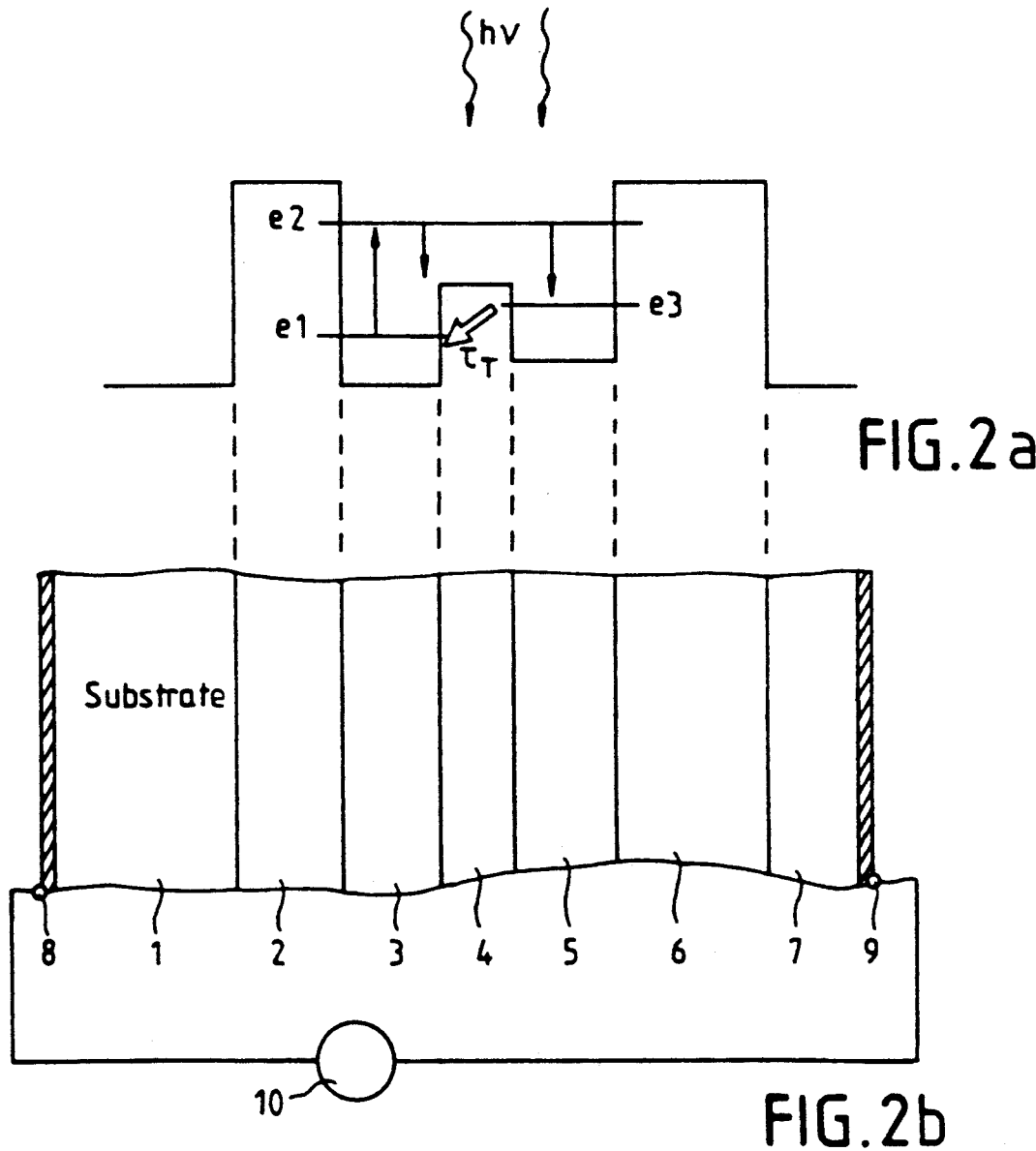
FIG. 2a
FIG. 2b

CAPACITIVE DETECTOR OF
ELECTROMAGNETIC WAVES

BACKGROUND OF THE INVENTION

1. Field of the Invention

The invention concerns an electromagnetic detector and, more particularly, a wave detector with quantum well semiconductors.

2. Description of the Prior Art

There are known radiation detection devices including at least one compositionally asymmetrical quantum well formed by a stack of materials with different forbidden gaps.

Thus, the French patent application No. 88 15956 filed on Dec. 6, 1988 describes a structure designed for the photocapacitive detection and the processing of optical radiation. This structure is formed by asymmetrical quantum wells as shown in FIG. 1a. During an illumination, the electrons are excited from an electron level e1 to an electron level e2, as the two levels do not have the same barycenter. This transition induces a dipole that can be detected at the terminals of a capacitor formed by such quantum wells. Other non-linear effects (such as frequency doubling or electro-optical effects), which may be used in modulators etc., are associated. Such effects have been confirmed experimentally (see Electronics Letters, E. Rosencher et al., "Second Harmonic Generation by Intersub-band Transitions in Compositionally Asymmetrical MQWs" Vol. 25, 16, Aug. 3, 1989, page 1063).

The invention concerns a structure that reinforces all these different above-mentioned effects. In order to highlight the object of the invention more clearly, let us return to the structure of FIG. 1. Under illumination, the rate of generation from the electron level e1 to the electron level e2 is (FIG. 1):

$$G_{12} = B_{12}(n_1 - n_2)\phi$$

$\phi$ is the photon flux, $n_1$ and $n_2$ are the populations at the levels e1 and e2;

$B_{12}$ is the coefficient of induced emission called EINSTEIN's coefficient.

The recombination is given by:

$$R = n_2/\tau$$

where $\tau$) is the time of relaxation from the level e2 towards the level e1. The polarization induced by the illumination is:

$$P = n_2 q \delta z$$

that is, $$P = q\delta_z \tau_{12} B_{12}(n_1 - n_2)\phi$$

where:

$\delta_z$ is the mean displacement of the electron gas q is the charge of the electron.

we therefore have $= n_2 = \tau B_{12}(n_1 - n_2)0$ It is clear that by increasing the lifetime $\tau$, we increase the induced dipole.

There is also a known device having a conduction band curve such as the one described in the U.S. Pat. No. 4,745,452 shown in FIG. 1b.

This device has a quantum well formed by two coupled quantum wells QWA and QWB. Two permitted electron levels $e_A$ and $e_B$ are below an intermediate barrier BA. However, there is a strong coupling between the levels $e_A$ and $e_B$ owing, notably, to the small thickness of the intermediate barrier BA (thickness smaller than 20 nm for example). The detection is then done by:

the optical transition $e_A$ towards $e_B$, and hence by the measurement of the variation in conductance of the structure due to the differences in electron mobility in each well.

A device such as this is limited to the detection of the electromagnetic waves below some TeraHz, that is, some meV.

The invention relates to a device working with waves that attain 30 to 100 TeraHs, that is, about 100 meV.

The invention concerns a detector enabling this problem to be resolved.

SUMMARY OF THE INVENTION

The invention therefore concerns a capacitive detector of electromagnetic waves, comprising:

a) a semiconductor structure having at least one stack of a first, second, third, fourth, fifth, sixth and seventh layers, for which the widths of the forbidden gaps make it possible to obtain the following profile of potential energy corresponding to the bottom of the conduction band for the electrons;

the lowest energy for the third layer;

intermediate energies for the fourth and fifth layers with a greater energy for the fourth layer as compared with the energy of the fifth layer, the fourth layer forming an internal barrier;

energies with values that are greater for the second and sixth layers forming the barriers of the well;

said structure being such that:

the energy corresponding to a first permitted electron level is smaller than the potential energy of the bottom of the conduction band of the material of the fourth layer, the energy corresponding to a second electron level is between the potential energy of the bottom of the conduction band of the material of the fourth layer and the potential energies of the bottom of the conduction band of the materials of the second and sixth layers, the energy corresponding to a third electron level is between the potential energy of the bottom of the conduction band of the material of the fourth layer and the potential energy of the bottom of the conduction band of the material of the fifth layer, this third electron layer being greater than the first electron level;

b) means for populating the first permitted electron level with electrons;

c) means for detecting an electrical field, connected to the first and seventh layers.

The potential energy of the bottom of the conduction band of the material of the fourth layer and the thickness of this fourth layer prevent a strong electron coupling between the first permitted level e1 and the third level e3.

The invention also concerns a detection device, wherein the difference in energy levels of the first and second levels corresponds substantially to the energy of the photons to be detected.

The invention concerns a capacitive detector of electromagnetic waves, wherein the widths of forbidden gaps of the second and sixth layers are substantially equivalent.

According to the invention, the first layer or the seventh layer at least has n type doping.

The third layer has n+ type doping.

The invention concerns a capacitive detector of electromagnetic waves, including at least one first stack of layers comprising at least the second, third, fourth and fifth layers placed on the first layer and, placed on the first stacks, a succession of stacks of layers each having layers identical to the first stack, then a sixth barrier layer and a seventh contact layer.

The invention concerns an electromagnetic wave detector wherein the means for detecting an electrical field include electrodes in contact with the external surfaces of the first and seventh layers.

BRIEF DESCRIPTION OF THE DRAWINGS

The various objects and characteristics of the invention will be understood more clearly from the following description, given purely by way of example and made with reference to the appended figures, of which:

FIGS. 1a and 1b show energy graphs of devices known in the prior art, described further above;

FIGS. 2a and 2b show a general view of an exemplary embodiment of the device of the invention;

DETAILED DESCRIPTION OF THE INVENTION

Figure 3:
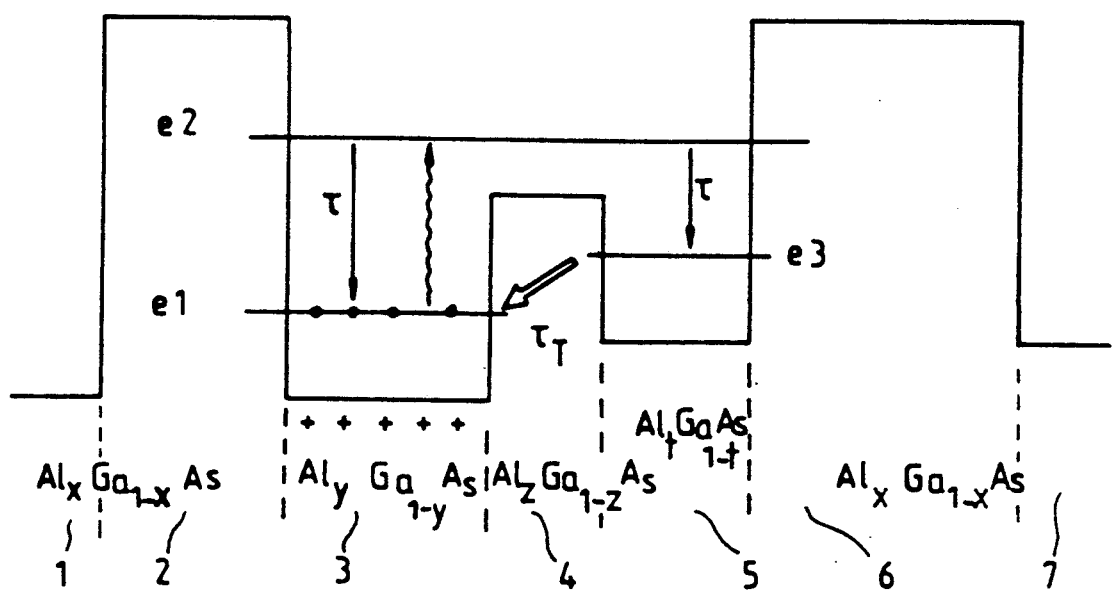
FIGS. 3 and 4 show a detailed view of an exemplary embodiment of the invention.

The object of the invention concerns a device having two bound electron levels e1 and e2 and a third electron level e3 which is strongly coupled to the second level e2 but weakly coupled to the first level e1.

Referring to FIGS. 2a and 2b, we shall now describe an exemplary embodiment of a device such as this. This device has a stack of layers 1 to 7 which shall be described hereinafter, notably with reference to the energy diagram corresponding to the conduction band (FIG. 2a).

The different layers are made of materials such that the structure of FIG. 2b takes the form of an asymmetrical quantum well, the layers 2 and 6 of which constitute its barriers.

The potential energy at the bottom of the conduction band of the layer 3 is the lowest and serves as an energy reference in the following description.

The potential energy of the bottom of at the conduction band of the layer 4 is higher than that of the layer 5 and that of the layer 3.

The potential energy at the bottom of the conduction band of the layer 5 is lower than that of the layer 4 and greater than or equal to that of the layer 3.

The layers 2 and 6 forming barriers of the quantum well have relatively high energy levels at the bottom of their respective conduction bands.

The layer 1, which takes the place of the substrate in the embodiment exemplified, and the layer 7 have relatively low energy levels at the bottom of their respective conduction bands.

These layers 1 and 7 are highly doped with n type doping.

However, in other embodiments (not shown), a single layer 1 or 7 is highly doped with n type doping.

According to FIGS. 2a and 2b, the active structure formed by the layers 2 to 6 has n type doping so that the majority of the electrons are localized in the deepest layer of the well (level e1). For example, the layer 3 has n type doping.

The external surfaces of the layers 1 and 7 have contact electrodes 8 and 9 enabling the connection of an electrical field testing device, such as 10, that can be used to detect an electrical field in the structure.

The structure of FIGS. 2a and 2b then takes the form of a quantum well having an internal barrier (layer 4). It includes:

a first permitted electron level e1 located between the bottom of the conduction band of the layer 3 and the bottom of the conduction band of the layer 4;

a second electron layer e2 between the bottom of the conduction band of the layer 4 and the bottom of the conduction band of the layers 2 and 6; and a third electron level e3 between the bottom of the conduction band of the layer 5 and the bottom of the conduction band of the layer 4, and greater than the first energy level e1.

The difference between the energy levels e1 and e2 corresponds to the photon energy hv of a radiation to be detected. Thus, under the effect of an electromagnetic radiation with a frequency $v$, electrons of the level e1 will be excited and will go to the level e2. After a relaxation time, a part at these electrons will return to the level e1 and another part will populate the level e3.

The transfer of charges to the level e3 creates a dipole and gives rise to an electrical field that can be detected at the terminals of the device. The charges of the level e3 will then flow due to the tunnel effect towards the level e1 after a relaxation time $\tau T$ (see FIG. 2a).

According to the exemplary embodiment of FIGS. 2a and 2b, the layer 1 is a substrate. However, the structure could be inverted. The layer 7 could then be the substrate, and the layer 1 would be the surface layer.

As an example, FIG. 3 exemplifies an embodiment based on epitaxiated materials that may or may not be stressed, such as GaAS/AlGaAS or InP/InGaAS.

For example, the layers 1 to 7 are made of the following materials:

layer 1: GaAs with n+ type doping;
layer 2: $Al_xGa_{1-x}As$;
layer 3: $Al_yGa_{1-y}As$ with n+ type doping at the center;
layer 4: $Al_zGa_{1-z}As$;
layer 5: $Al_tGa_{1-t}As$;
layer 6: $Al_xGa_{1-x}As$;
layer 7: GaAs with n+ type doping.

In these formulae, x, y, z and t are such that:

$$0 \leq y \leq t < z < x.$$

Since the asymmetry of the structure concerns notably the layers 3 and 5, it can be controlled by the parameters y and t (Al composition) as well as by the thickness of the layers.

The structure, notably the layer 3, is doped in such a way that, at rest, the majority of the electrons are localized in the deepest well (level e1). During irradiation, ($hv \approx e2-e1$) the electrons are excited from level e1 to level e2 and relax either towards level e1 or towards level e3 in a time of about 0.2 ps.

Those that relax to the level e3 will remain therein until they transit by the tunnel effect, towards the level e1.

This mechanism is described by the following equations:

$$\frac{\delta n_2}{\delta t} = G_{12} + G_{32} - n_2 (1/\tau_{12} + 1/\tau_{23})$$

$$\frac{\delta n_1}{\delta t} = -G_{12} + n_2/\tau_{12} + n_3/\tau_T$$

$$\frac{\delta n_3}{\delta t} = -G_{32} + n_2/\tau_{23} - n_3/\tau_T$$

wherein:
n1, n2 and n3 are the populations of electrons at the levels e1, e2, e3, respectively;
the rates of electron generation $G_{12}$ and $G_{32}$ have been described previously;
$\tau_{12}$ is the time of transit from the level e1 to the level e2;
$\tau_{23}$ is the time of transit from the level e2 to the level e3; and
$\tau_T$ is the time of transit by tunnel effect from the level e3 to the level e1.

To simplify the computation, it is assumed that the lifetimes $\tau_{12}$ and $\tau_{32}$ are substantially equal($\approx \tau$) and that only level e1 is populated:

$$n_2 << n_1, n_3 << n_1, n_1 \sim N_D$$

($N_D$=surface density of doping of the layer 3)

$$G_{12} \sim B N_D \phi$$

$$G_{32} \sim B n_3 \phi$$

and the stationary state:

$$n_3 = (B\phi/(\phi B + 2/\tau_T)) N_D \approx (B\tau_T/2)N_D\phi.$$

If this state is compared with the one described previously in relation with the structure of FIG. 1 where the following was found:

$$n_2 \sim b\tau N_D \phi,$$

it is found that the gain in population is therefore an the order of $\tau_T/2\tau$.

Figure 4:
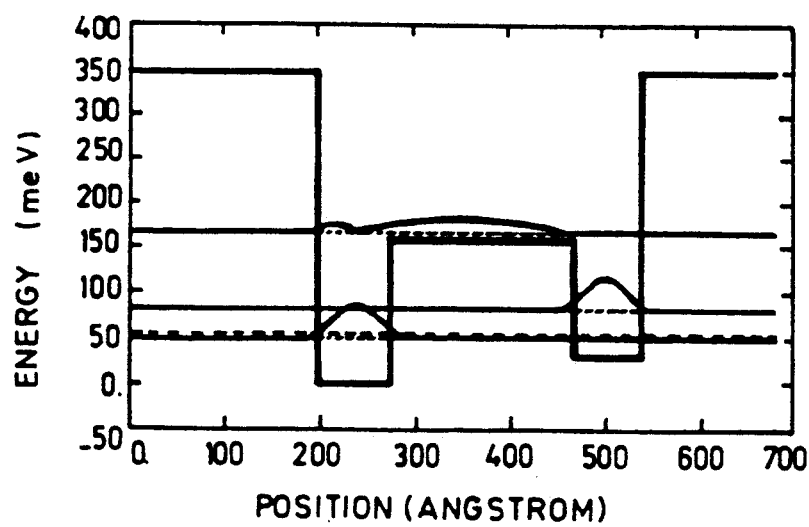

Now, the tunnel effect times can be controlled by the thickness of the insulator barrier or its composition, or even by a polarization applied to the structure. An optimization has to be done to increase this tunnel effect time without adversely affecting the different oscillator forces between the levels and in keeping the difference e2−e1 of the energy levels close to hν (the energy of the electromagnetic wave). The numerical simulations, one example of which is shown in FIG. 4, foresee gains of three magnitudes for the different non-linear coefficients as compared with those of the prior art.

The invention provides for the making of a structure formed by coupled asymmetrical quantum wells, as described previously, designed to present very substantial non-linear optical characteristics, especially characteristics of optical rectification.

Figure 5:
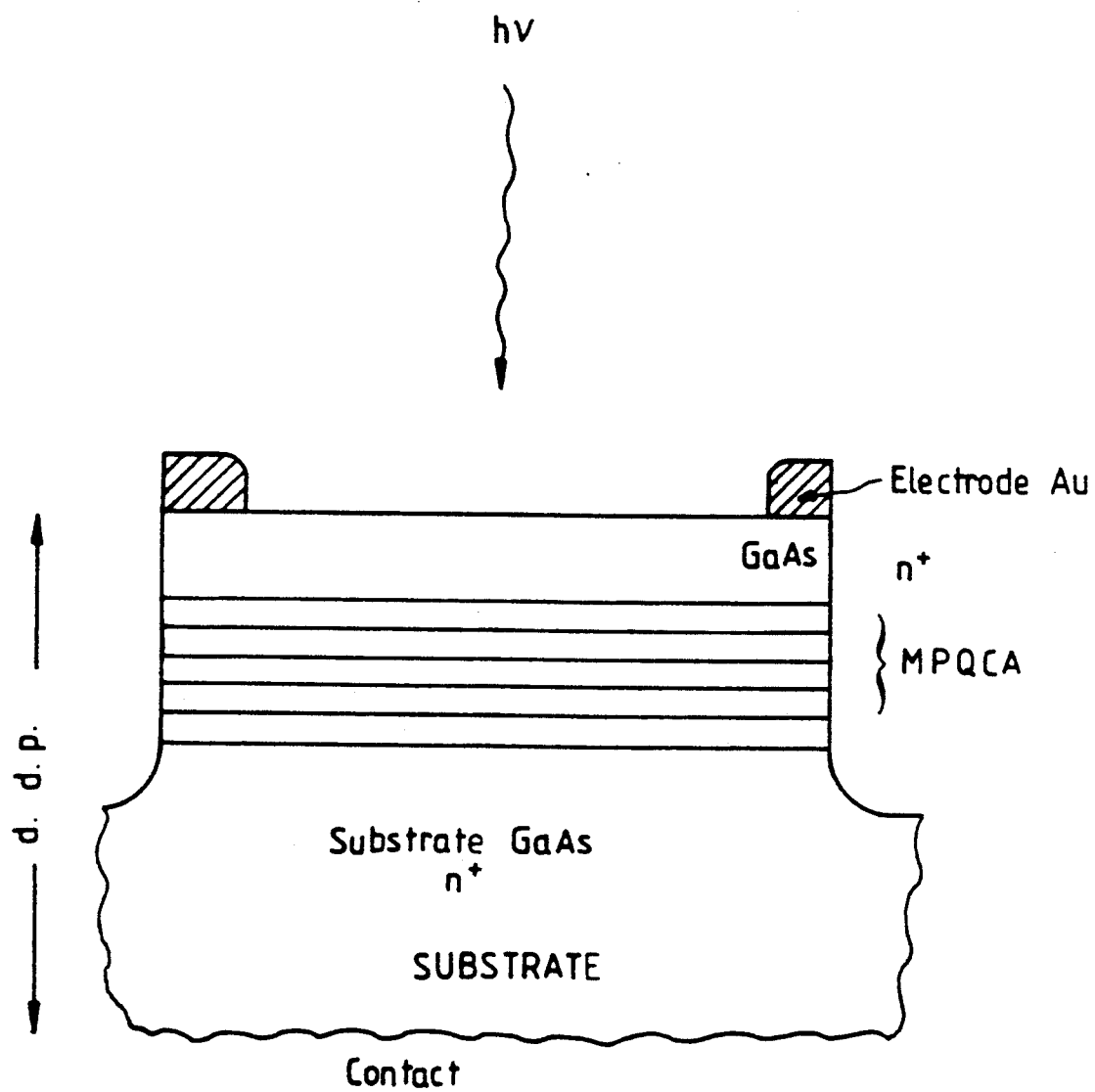
FIG. 5 shows another exemplary embodiment of the invention.

FIG. 5 shows an arrangement of the layers to make a capacitive type detector. In this structure, a stacking of compositionally asymmetrical wells such as was described previously is done so as to create a compositionally asymmetrical multiple quantum well MPQCA.

The substrate has an ohmic contact. The upper surface is covered with a contact layer (n+ doped GaAs) provided with electrodes (made of gold for example). This upper surface is illuminated by a radiation hν to be detected. The optical transitions or the thermal excitations induce a measurable dipole in the form of a potential difference, at the terminals of the sample, which can be detected by a detector connected to the electrodes.

Figure 6:
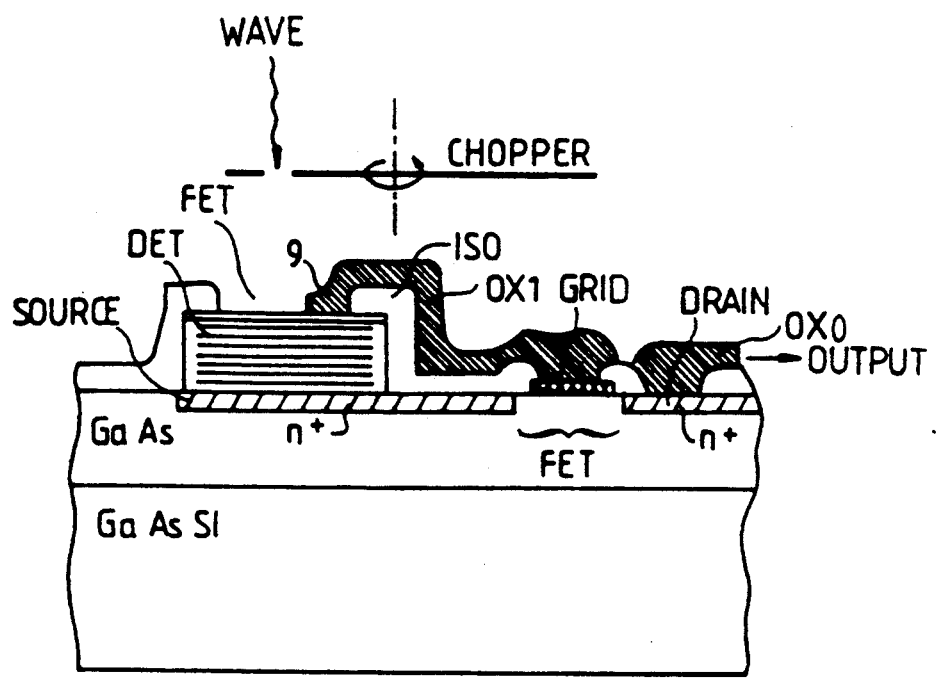
FIG. 6 exemplifies the integration of a device according to the invention with a field-effect transistor.

FIG. 6 shows the integration of a device according to the invention with a transistor such as a field-effect transistor. In this figure, the reference DET indicates the device of the invention made in the form of a multiple quantum well.

The device DET is made on a GaAs substrate strongly doped with n type doping. The n+ doped substrate acts as a source for the field-effect transistor.

FIG. 6 shows an integrated device such as this wherein the detection device DET, formed by a stacking of asymmetrical quantum wells, is integrated with the source of a field-effect transistor.

According to FIG. 6, the structure according to the invention is made, for example, of gallium arsenide and comprises:
on a semi-insulator GaAs substrate, a layer of n doped GaAs comprising two n+ doped zones forming the source and the drain;
a metal layer forming the gate of the transistor and located between the two n+ doped zones;
the detection zone DET formed by a stacking of asymmetrical quantum wells and located on the n+ doped zone of the source of the transistor;
an insulator layer ISO making it possible to insulate the flanks of the detection device as well as the connections of the transistor;
a metal connection OX1 enabling the upper face of the device DET to be connected to the gate of the transistor; and
a metal connection OX0 connected to the drain of the transistor and giving an output signal.

The upper face of the device DET has a window FE that has neither any insulator nor any metal connection, and enables a radiation to act on the device DET.

The radiation can be transmitted to the device DET by a mechanical or electro-optical modulation device such as the one shown in FIG. 6.

The device DET thus enables a difference in potential to be detected between the source and the gate. At the drain connection OX0, there is detected an output voltage signal proportionate to the intensity of the radiation given to the device DET.

Figure 7:
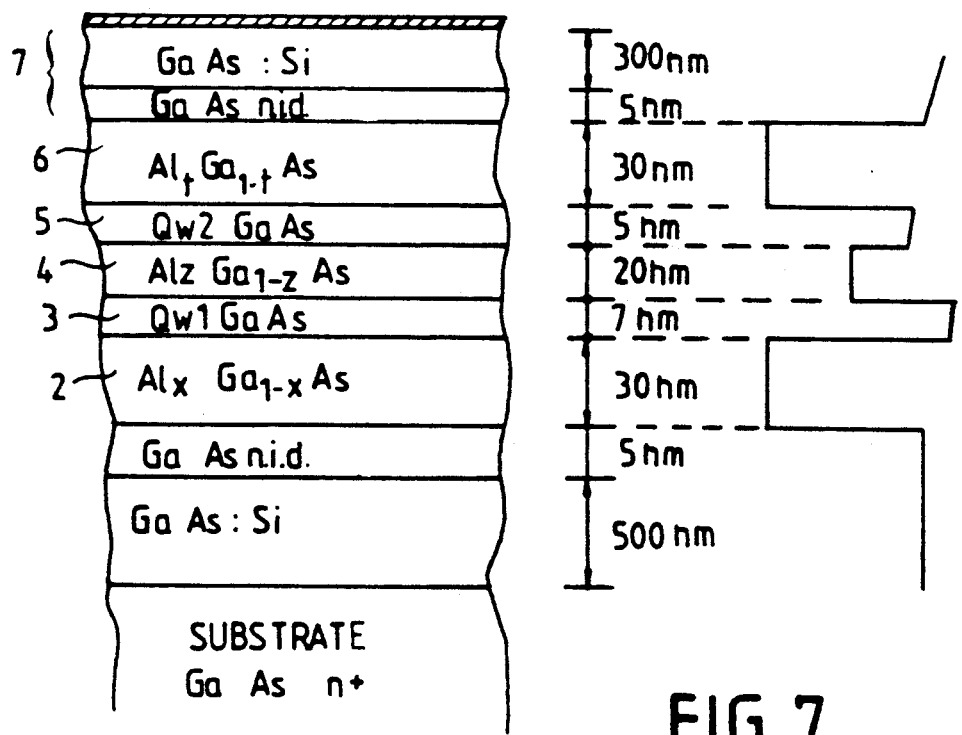
FIG. 7 shows a numerical example of the device according to the invention.

FIG. 7 exemplifies an embodiment, with numerical values, of a device according to the invention. According to this embodiment, the device has been made as a GaAs based device on a GaAs substrate highly doped with n type doping.

This substrate is covered with a 500 nm thick buffer layer of silicon doped GaAS, then with a 5 nm thick spacer layer of non-intentionally doped GaAs.

The following layers are made on this unit:
layer 2: made of $Al_xGa_{1-x}As$, 30 nm thick, with x=0.42;
layer 3 made of GaAS, 7 nm thick, silicon doped ($N_D=4.3\times10^{11}$ cm$^{-2}$);

layer 4: made of $Al_zGa_{1-z}As$, 20 nm thick, with $z=0.21$;

layer 5: made of non-intentionally doped GaAS, 5 nm thick.

This stacking of layers 2 to 5 is repeated 50 times and then, on the stack made, the following layers are made:

layer 6: made of $Al_xGa_{1-x}As$, 30 nm thick, with $x=0.42$;

layer 7: made of a spacer made of non-intentionally doped GaAS and a layer of silicon doped GaAs with respective thicknesses of 5 and 300 Nm.

It is clear that the above description has been given purely as a non-restrictive example and that other variants can be contemplated without going beyond the scope of the invention. The numerical examples and the nature of the materials indicated have been given purely to illustrate the description.

What is claimed is:

1. A capacitive detector for electromagnetic waves, comprising:

a) a semiconductor structure having at least one stack of first, second, third, fourth, fifth, sixth and seventh layers forming an asymmetrical quantum well, respective widths of forbidden gaps of the first to seventh layers providing the following profile of potential energies corresponding to a bottom of a conduction band for an electron;

a lowest energy for the third layer;

intermediate energies for the fourth and fifth layers with a greater energy for the fourth as compared with the fifth layer, the fourth layer forming an internal barrier;

energies of the second and sixth layers having values that are greater than the energies of the third, fourth and fifth layers, the second and sixth layers forming barriers of the asymmetrical quantum well; said structure being such that:

an energy corresponding to a first permitted electron level is smaller than the potential energy at the bottom of the conduction band of the material of the fourth layer;

an energy corresponding to a second permitted electron level is between the potential energy at the bottom of the conduction band of the material of the fourth layer and the potential energies at the bottom of the conduction band of the materials of the second and sixth layers;

an energy corresponding to a third permitted electron level is between the potential energy at the bottom of the conduction band of the material of the fourth layer and the potential energy at the bottom of the conduction band of the material of the fifth layer, the energy of this third permitted electron level being greater than that of the first permitted electron level;

and the potential energy at the bottom of the conduction band of the material of the fourth layer and a thickness of this fourth layer prevent a strong electron coupling between the first permitted electron level and the third permitted electron level;

b) means for populating the first permitted electron level with electrons, the means for populating the first permitted electron level with electrons comprising n type doping of at least one of the second to sixth layers which provides a majority of electrons localized at the third layer; and c) means for detecting an electrical field, in the semiconductor structure, created by the transfer of charges to the third permitted electron level due to radiation of the detector with photon energy, the means for detecting being connected solely to the first and seventh layers.

2. A detection device according to claim 1, wherein a difference between energy levels of the first and second levels corresponds substantially to an energy of a photon to be detected.

3. A capacitive detector of electromagnetic waves according to claim 1, wherein the widths of forbidden gaps of the second and sixth layers are substantially equivalent.

4. A capacitive detector of electromagnetic waves according to claim 1, wherein the widths of forbidden gaps of the first and seventh layers are substantially equivalent.

5. A detector of electromagnetic waves according to claim 1, wherein at least one of the first layer and the seventh layer has n type doping.

6. A detector of electromagnetic waves according to claim 1, wherein the third layer has n+ type doping.

7. An electromagnetic wave detector according to claim 1, wherein the means for detecting an electrical field include electrodes in contact with external surfaces of the first and seventh layers.

8. A capacitive detector for electromagnetic waves, comprising:

a semiconductor structure forming a stack of quantum wells, the semiconductor structure comprising, in succession:

a first stack of second, third, fourth, and fifth layers placed on a first layer, respective widths of forbidden gaps of the first to fifth layers providing the following profile of potential energies corresponding to a bottom of a conduction band for an electron;

a lowest energy for the third layer;

intermediate energies for the fourth and fifth layers with a greater energy for the fourth as compared with the fifth layer, the fourth layer forming an internal barrier;

an energy of the second layer having a value that is greater than the energies of the third, fourth and fifth layer, the second layer forming a barrier of the stack of asymmetrical quantum wells; said structure being such that:

an energy corresponding to a first permitted electron level is smaller than the potential energy at the bottom of the conduction band of the material of the fourth layer;

an energy corresponding to a second permitted electron level is between the potential energy at the bottom of the conduction band of the material of the fourth layer and the potential energy at the bottom of the conduction band of the material of the second layer;

an energy corresponding to a third permitted electron level is between the potential energy at the bottom of the conduction band of the material of the fourth layer and the potential energy at the bottom of the conduction band of the material of the fifth layer, the energy of this third permitted electron level being greater than that of the first permitted electron level;

and the potential energy at the bottom of the conduction band of the material of the fourth layer and a thickness of this fourth layer prevent a strong electron coupling between the first permitted electron level and the third permitted electron level;

a plurality of stacks of layers, each having layers identical to the first stack, positioned on the first stack;

a sixth layer substantially similar to the second layer and forming a further barrier of the stack of asymmetrical wells; and a seventh layer forming a contact layer;

b) means for populating each of the first permitted electrons levels with electrons, the means for populating the first permitted electron level with electrons comprising n type doping of at least one of the layers of the stacks to provide a majority of electrons localized at the third layer of each stack;

c) means for detecting an electrical field in the semiconductor structure created by a transfer of charges to the third permitted electron levels due to radiation of the detector with photon energy; and d) a field effect transistor, the first and seventh layers of the semiconductor structure forming the stack of quantum wells being connected between a source and a gate of the field effect transistor.

* * * * *